United States Patent
Terashita

(10) Patent No.: US 9,355,762 B2
(45) Date of Patent: May 31, 2016

(54) CERAMIC ELECTRONIC COMPONENT AND METHOD FOR MANUFACTURING CERAMIC ELECTRONIC COMPONENT

(71) Applicant: Murata Manufacturing Co., Ltd., Nagaokakyo-shi, Kyoto-fu (JP)

(72) Inventor: Yosuke Terashita, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 65 days.

(21) Appl. No.: 14/501,214

(22) Filed: Sep. 30, 2014

(65) Prior Publication Data
US 2015/0115776 A1    Apr. 30, 2015

(30) Foreign Application Priority Data

Oct. 25, 2013  (JP) ................................. 2013-221786
Jul. 30, 2014  (JP) ................................. 2014-154785

(51) Int. Cl.
| | |
|---|---|
| H01G 4/228 | (2006.01) |
| H01C 7/00 | (2006.01) |
| H01G 4/12 | (2006.01) |
| C25D 3/12 | (2006.01) |
| H01F 17/00 | (2006.01) |
| H01F 27/29 | (2006.01) |
| H01L 41/047 | (2006.01) |
| H01L 41/293 | (2013.01) |
| C25D 5/12 | (2006.01) |
| C25D 5/56 | (2006.01) |

(52) U.S. Cl.
CPC ............ *H01C 7/008* (2013.01); *C25D 3/12* (2013.01); *C25D 5/12* (2013.01); *C25D 5/56* (2013.01); *H01F 17/0013* (2013.01); *H01F 27/29* (2013.01); *H01G 4/1209* (2013.01); *H01L 41/0472* (2013.01); *H01L 41/0477* (2013.01); *H01L 41/293* (2013.01)

(58) Field of Classification Search
CPC ........... H01F 4/008; H01F 4/30; H01F 4/005; H01F 4/12; H01F 4/232

USPC ............... 361/306.3, 301.2, 301.4, 303–305, 361/306.1, 321.1, 321.2
See application file for complete search history.

(56) References Cited

U.S. PATENT DOCUMENTS

| | | | | |
|---|---|---|---|---|
| 7,271,114 B2 * | 9/2007 | Kawamura | ............. | B82Y 30/00 361/305 |
| 7,632,427 B2 * | 12/2009 | Oda | ........................ | H01B 1/22 252/512 |
| 7,960,302 B2 * | 6/2011 | Zhang | ................. | C04B 35/4682 501/137 |
| 8,405,954 B2 † | 3/2013 | Koga | | |
| 8,547,683 B2 † | 10/2013 | Saruban | | |
| 8,673,798 B2 * | 3/2014 | Nakamura | .......... | C04B 35/4682 501/136 |
| 8,956,486 B2 * | 2/2015 | Matsui | ..................... | H01G 4/12 156/89.12 |
| 8,988,850 B1 * | 3/2015 | Kodama | ................. | H01G 4/232 361/301.4 |
| 2012/0319536 A1 † | 12/2012 | Sakuratani | | |

FOREIGN PATENT DOCUMENTS

JP        11-162771 A       6/1999

* cited by examiner
† cited by third party

FOREIGN PATENT DOCUMENTS

*Primary Examiner* — Nguyen T Ha
(74) *Attorney, Agent, or Firm* — Keating & Bennett, LLP

(57) ABSTRACT

A ceramic electronic component includes a ceramic body and first and second outer electrodes. The first and second outer electrodes respectively include first and second resin-containing electrode layers and first and second Ni plating layers. The first and second Ni plating layers are respectively provided on the first and second resin-containing electrode layers. When a thickness of the first or second Ni plating layer is t1 and a distance by which a portion of the first or second Ni plating layer that is in contact with the second principal surface extends in the length direction is t2, t2/t1 is less than about 1.

20 Claims, 2 Drawing Sheets

CERAMIC ELECTRONIC COMPONENT AND METHOD FOR MANUFACTURING CERAMIC ELECTRONIC COMPONENT

BACKGROUND OF THE INVENTION

1. Field of the Invention

The present invention relates to a ceramic electronic component and a method for manufacturing the ceramic electronic component.

2. Description of the Related Art

Monolithic ceramic electronic components, such as monolithic ceramic capacitors, are included in various types of electronic devices. Monolithic ceramic capacitors generally include a ceramic body and first and second electrodes that are arranged in the ceramic body and that oppose each other with ceramic portions interposed therebetween.

In recent years, environments in which monolithic ceramic electronic components are used have become more severe. For example, monolithic ceramic electronic components included in mobile devices, such as cellular phones and portable audio players, are required to be resistant to shock when the mobile devices are dropped. More specifically, it is necessary to prevent the monolithic ceramic electronic components from becoming separated from mounting boards or cracking due to shock when the mobile devices are dropped.

Monolithic ceramic electronic components, such as electronic control units (ECU), included in on-vehicle devices are required to be heat resistant. More specifically, it is necessary to prevent the monolithic ceramic electronic components from cracking even when the monolithic ceramic electronic components receive a bending stress generated by thermal contraction or expansion of mounting boards or a tensile stress applied to outer electrodes. Ceramic bodies crack when the above-described bending stress or tensile stress exceeds the strength of the ceramic bodies.

Japanese Unexamined Patent Application Publication No. 11-162771, for example, describes a monolithic ceramic electronic component including an outer electrode that includes a resin-containing electrode layer made of a resin containing metal powder. In the monolithic ceramic electronic component according to Japanese Unexamined Patent Application Publication No. 11-162771, the resin-containing electrode layer buffers external stress applied to a ceramic body. Therefore, the ceramic body does not easily crack.

However, even when the resin-containing electrode layer is formed, there is a risk that the ceramic body will crack due to a stress received from a board.

SUMMARY OF THE INVENTION

Preferred embodiments of the present invention provide a ceramic electronic component that does not easily crack and a method for manufacturing such a ceramic electronic component.

According to a preferred embodiment of the present invention, a ceramic electronic component includes a ceramic body and an outer electrode. The ceramic body includes first and second principal surfaces, first and second side surfaces, and first and second end surfaces. The first and second principal surfaces extend in a length direction and a width direction. The first and second side surfaces extend in the length direction and a thickness direction. The first and second end surfaces extend in the width direction and the thickness direction. The outer electrode is arranged so as to extend from the first end surface to the second principal surface. The outer electrode includes a resin-containing electrode layer and a plating layer. The resin-containing electrode layer includes a conductive material and a resin. The plating layer is provided on the resin-containing electrode layer. The plating layer includes a Ni plating layer. When a thickness of the Ni plating layer is t1 and a distance by which a portion of the Ni plating layer that is in contact with the second principal surface extends in the length direction is t2, t2/t1 is less than about 1, for example.

Preferably, t2/t1 is greater than about 0.06, for example.

The outer electrode preferably further includes a baked electrode layer disposed between the ceramic body and the resin-containing electrode layer.

According to another preferred embodiment of the present invention, a method for manufacturing the above-described ceramic electronic component includes forming the Ni plating layer by using a Ni plating bath having a pH of about 4.4 or more, for example.

According to various preferred embodiments of the present invention, a ceramic electronic component that does not easily crack and a method for manufacturing the ceramic electronic component are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
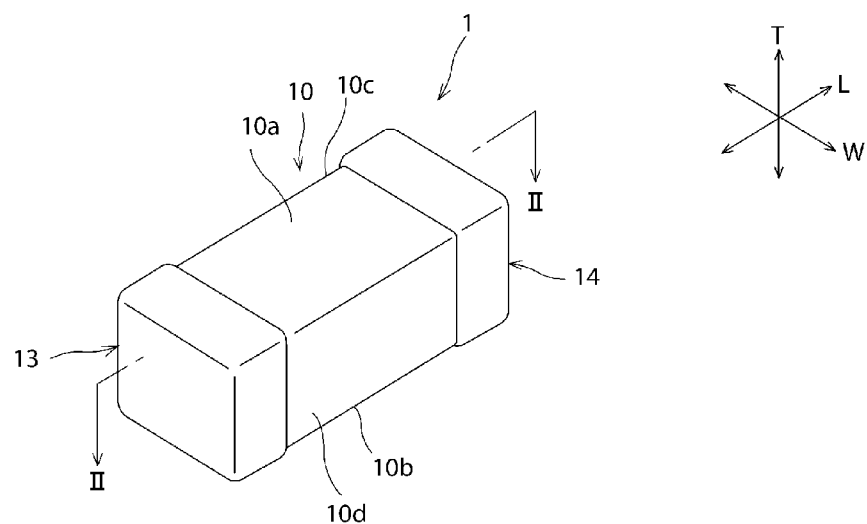
FIG. 1 is a schematic perspective view of a ceramic electronic component according to a first preferred embodiment of the present invention.

Preferred embodiments of the present invention will now be described. The preferred embodiments are merely examples, and the present invention is not limited to the preferred embodiments in any way.

In each of the figures referred to in the description of preferred embodiments, components having the same or substantially the same functions are denoted by the same reference numerals. The figures referred to in the preferred embodiments are drawn schematically. Dimensional ratios and the like of objects drawn in the figures may differ from the actual dimensional ratios and the like of the objects. The dimensional ratios and the like of the objects may also differ between the figures. Specific dimensional ratios and the like of the objects are to be determined in consideration of the following description.

The structure of a ceramic electronic component 1 will now be described.

First Preferred Embodiment

Figure 2:
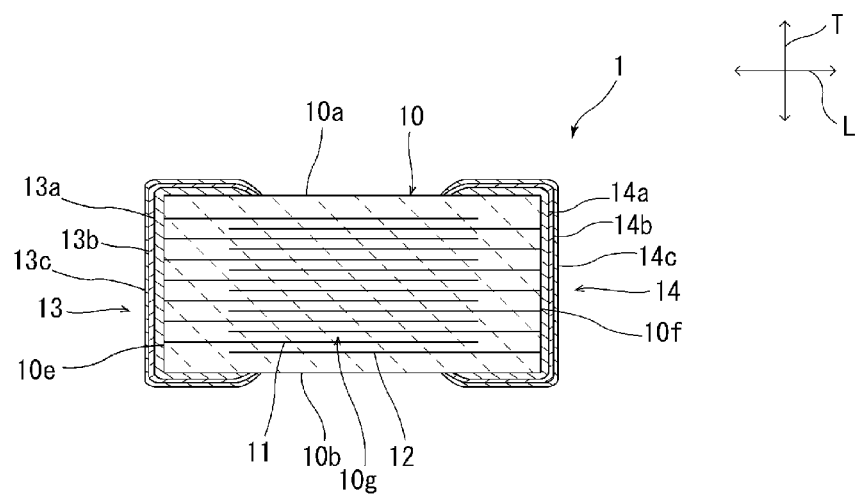
FIG. 2 is a schematic sectional view of FIG. 1 taken along line II-II.

FIG. 1 is a schematic perspective view of a ceramic electronic component according to a first preferred embodiment of the present invention. FIG. 2 is a schematic sectional view of FIG. 1 taken along line II-II.

The ceramic electronic component 1 illustrated in FIGS. 1 and 2 may be a ceramic capacitor, a piezoelectric component, a thermistor, an inductor, or the like, for example.

The ceramic electronic component 1 includes a ceramic body 10 preferably having a rectangular or substantially rectangular parallelepiped shape. The ceramic body 10 includes first and second principal surfaces 10a and 10b, first and second side surfaces 10c and 10d (see FIG. 2), and first and second end surfaces 10e and 10f (see FIG. 2). The first and second principal surfaces 10a and 10b extend in a length direction L and a width direction W. The first and second side surfaces 10c and 10d extend in a thickness direction T and the length direction L. The first and second end surfaces 10e and 10f extend in the thickness direction T and the width direction W. The length direction L, the width direction W, and the thickness direction T are perpendicular or substantially perpendicular to each other.

In the present invention, the "rectangular parallelepiped shape" includes rectangular parallelepiped shapes having rounded corners and edges. In other words, objects having a "rectangular parallelepiped shape" are all objects including the first and second principal surfaces, the first and second side surfaces, and the first and second end surfaces. In addition, projections and recesses, for example, may be formed over the entire or partial area of each of the principal surfaces, the side surfaces, and the end surfaces.

The dimensions of the ceramic body 10 are not particularly limited. For example, the ceramic body 10 preferably has a thickness of about 0.2 mm to about 3.0 mm, a length of about 0.4 mm to about 5.7 mm, and a width of about 0.2 mm to about 5.0 mm.

The ceramic body 10 is made of a ceramic suitable for the function of the ceramic electronic component 1. More specifically, in the case where the ceramic electronic component is a capacitor, the ceramic body 10 may be made of a dielectric ceramic. Non-limiting examples of dielectric ceramics include $BaTiO_3$, $CaTiO_3$, $SrTiO_3$, and $CaZrO_3$. The ceramic body 10 may also contain a sub-component, such as a Mn compound, a Mg compound, a Si compound, a Fe compound, a Cr compound, a Co compound, a Ni compound, or a rare-earth compound, as appropriate in accordance with the characteristics required of the ceramic electronic component 1.

In the case where the ceramic electronic component 1 is a piezoelectric component, the ceramic body may be made of a piezoelectric ceramic. Non-limiting examples of piezoelectric ceramics include a lead zirconate titanate (PZT) ceramic.

In the case where the ceramic electronic component 1 is a thermistor, the ceramic body may be made of a semiconductor ceramic. Non-limiting examples of semiconductor ceramics include a spinel ceramic.

In the case where the ceramic electronic component 1 is an inductor, the ceramic body may be made of a magnetic ceramic. Non-limiting examples of magnetic ceramics include a ferrite ceramic.

As illustrated in FIG. 2, a plurality of first inner electrodes 11 and a plurality of second inner electrodes 12 are provided in the ceramic body 10.

The first inner electrodes 11 preferably have a rectangular or substantially rectangular shape. The first inner electrodes 11 are parallel or substantially parallel to the first and second principal surfaces 10a and 10b (see FIG. 1). In other words, the first inner electrodes 11 extend in the length direction L and the width direction W. The first inner electrodes 11 are exposed at the first end surface 10e, and are not exposed at the first and second principal surfaces 10a and 10b, the first and second side surfaces 10c and 10d, and the second end surface 10f.

The second inner electrodes 12 preferably have a rectangular or substantially rectangular shape. The second inner electrodes 12 are parallel or substantially parallel to the first and second principal surfaces 10a and 10b (see FIG. 1). In other words, the second inner electrodes 12 extend in the length direction L and the width direction W. Thus, the second inner electrodes 12 and the first inner electrodes 11 are parallel or substantially parallel to each other. The second inner electrodes 12 are exposed at the second end surface 10f, and are not exposed at the first and second principal surfaces 10a and 10b, the first and second side surfaces 10c and 10d, and the first end surface 10e.

The first and second inner electrodes 11 and 12 are alternately arranged in the thickness direction T. The first and second inner electrodes 11 and 12 that are adjacent to each other in the thickness direction T oppose each other with a ceramic portion 10g interposed therebetween. The thickness of each ceramic portion 10g may be about 0.4 μm to about 100 μm, and is preferably about 1 μm to about 80 μm, for example. In the case where the ceramic electronic component 1 is a capacitor, each ceramic portion 10g is preferably thin from the viewpoint of increasing the capacity of the ceramic electronic component 1.

The first and second inner electrodes 11 and 12 may be made of an appropriate conductive material. For example, the first and second inner electrodes 11 and 12 may be made of a metal selected from a group including Ni, Cu, Ag, Pd, and Au, or an alloy, such as an Ag—Pd alloy, containing one or more metals selected from the group including Ni, Cu, Ag, Pd, and Au.

Preferably, the thickness of the first and second inner electrodes 11 and 12 is, for example, about 0.2 μm to about 2.0 μm, for example.

As illustrated in FIGS. 1 and 2, the ceramic electronic component 1 includes first and second outer electrodes 13 and 14. The first outer electrode 13 is electrically connected to the first inner electrodes 11 on the first end surface 10e. The second outer electrode 14 is electrically connected to the second inner electrodes 12 on the second end surface 10f.

The first outer electrode 13 extends from the first end surface 10e to the first and second principal surfaces 10a and 10b and the first and second side surfaces 10c and 10d. The second outer electrode 14 extends from the second end surface 10f to the first and second principal surfaces 10a and 10b and the first and second side surfaces 10c and 10d. The first and second outer electrodes 13 and 14 may instead extend only to the first and second principal surfaces 10a and 10b, or so that they do not extend to a principal surface or a side surface.

The first and second outer electrodes 13 and 14 may be made of an appropriate conductive material. Also, the first and second outer electrodes 13 and 14 may be made of a plurality of conductive films.

More specifically, the first outer electrode 13 includes a first baked electrode layer 13a, and the second outer electrode 14 includes a second baked electrode layer 14a.

The first baked electrode layer 13a is arranged so as to cover the end surface 10e of the ceramic body and extend to certain positions on the principal surfaces 10a and 10b and the side surfaces 10c and 10d. The second baked electrode layer 14a is arranged so as to cover the end surface 10f of the ceramic body 10 and extend to certain positions on the principal surfaces 10a and 10b and the side surfaces 10c and 10d.

A first resin-containing electrode layer 13b is provided on the first baked electrode layer 13a. A second resin-containing electrode layer 14b is provided on the second baked electrode layer 14a. A first plating layer 13c is provided on the first resin-containing electrode layer 13b. A second plating layer 14c is provided on the second resin-containing electrode layer 14b.

The first and second baked electrode layers 13a and 14a are preferably formed by, for example, applying conductive paste containing a conductive material and a glass and burning the conductive paste. The conductive material contained in the first and second baked electrode layers 13a and 14a may be, for example, Cu, Ni, Ag, Pd, an Ag—Pd alloy, or Au. The glass contained in the first and second baked electrode layers 13a and 14a may be, for example, a glass containing B, Si, Ba, Mg, Al, or Li.

Each of the first and second baked electrode layers 13a and 14a may either be baked together with the ceramic body 10, or be formed by applying the conductive paste to the ceramic body 10 and baking the conductive paste, for example.

Each of the first and second baked electrode layers 13a and 14a may include a plurality of layers, for example. In this case, the thickness of the first electrode layer, more specifically, the thickness of the thickest portion of the first electrode layer, is preferably about 10 µm to about 100 µm, for example. Similar to the first and second baked electrode layers 13a and 14a, each of the first and second resin-containing electrode layers 13b and 14b and the first and second plating layers 13c and 14c may also include a plurality of layers.

The first resin-containing electrode layer 13b covers the first baked electrode layer 13a. The second resin-containing electrode layer 14b covers the second baked electrode layer 14a. More specifically, the first resin-containing electrode layer 13b is disposed on a portion of the first baked electrode layer 13a disposed on the first end surface, and preferably extends to portions of the first baked electrode layer 13a disposed on the first principal surface and the first side surface. The second resin-containing electrode layer 14b is disposed on a portion of the second baked electrode layer 14a disposed on the second end surface, and preferably extends to portions of the second baked electrode layer 14a disposed on the second principal surface and the second side surface. The first resin-containing electrode layer 13b may be provided only on the portion of the first baked electrode layer 13a disposed on the first end surface, and the second resin-containing electrode layer 14b may be provided only on the portion of the second baked electrode layer 14a disposed on the second end surface.

Preferably, the thickness of the first and second resin-containing electrode layers 13b and 14b is, for example, about 10 µm to about 150 µm.

The first and second resin-containing electrode layers 13b and 14b include a conductive material and a resin. Since the first and second resin-containing electrode layers 13b and 14b include a resin, the first and second resin-containing electrode layers 13b and 14b are more flexible than, for example, the plating layers and the conductive layers formed by baking conductive paste. Therefore, even when the ceramic electronic component 1 receives a physical shock or a shock due to the heat cycle, the first and second resin-containing electrode layers 13b and 14b define and serve as buffer layers, and cracking of the ceramic electronic component 1 is significantly reduced or prevented.

The conductive material may be, for example, Ag or a metal powder coated with Ag. The metal powder is preferably Cu or Ni. The conductive material may instead be Cu subjected to an anti-oxidation treatment.

The reason why Ag is preferably used as the conductive material is because Ag is suitable for use as an electrode material because of its low specific resistance. In addition, since Ag is a noble metal, it is not easily oxidized and is highly weatherproof.

The shape of the particles of the conductive material is not particularly limited, and may be, for example, spherical or flat. Preferably, the conductive material is a mixture of spherical and flat particles. The average particle diameter of the conductive material is not particularly limited, and may be, for example, about 1.0 µm to about 10 µm.

The particles of the conductive material contact each other, thus providing conduction paths in the first and second resin-containing electrode layers 13b and 14b.

Various types of known thermosetting resins, such as an epoxy resin, a phenolic resin, a urethane resin, a silicone resin, and a polyimide resin, may be used as the resin contained in the first and second resin-containing electrode layers 13b and 14b. In particular, an epoxy resin, which has a high heat resistance, a high moisture resistance, and a high adherence, is one of the most suitable resins.

The first and second resin-containing electrode layers 13b and 14b preferably include a curing agent in addition to the thermosetting resin. In the case where an epoxy resin is used as a base resin, various types of compounds, such as a phenolic compound, an amine compound, an acid anhydride compound, or an imidazole compound, may be used as a curing agent for the epoxy resin.

The first plating layer 13c covers the first resin-containing electrode layer 13b. The second plating layer 14c covers the second resin-containing electrode layer 14b. In the present preferred embodiment, Ni, which has a high barrier performance against solder, is preferably used as the material of the first and second plating layers 13c and 14c. The first and second plating layers 13c and 14c will be hereinafter referred to as a first Ni plating layer and a second Ni plating layer, respectively.

The thickness of the first and second Ni plating layers 13c and 14c is preferably about 1 µm to about 15 µm, for example. Here, Sn plating layers may be provided on the first and second Ni plating layers 13c and 14c.

As a result of intensive studies, the inventor of the present invention has discovered the cause of cracking. More specifically, bending stress that is expected to be absorbed by the resin-containing electrode layers is directly applied to the ceramic body through portions of the Ni plating layers that are in contact with the ceramic body. As a result, cracks are formed so as to extend from the ends of the portions of the Ni plating layers that are in contact with the ceramic body toward the inner region of the ceramic body.

The mechanism of cracking is assumed to be as follows. That is, the main component of the bending stress is a tensile stress applied to the ceramic body over the entire region thereof in the length direction, and this is the major cause of cracking. In practice, cracking does not occur only by the tensile stress unless the tensile stress is very large or is applied suddenly. However, even when the tensile stress is small and is not large enough to cause cracking, cracking will occur if a shearing stress is applied in a direction perpendicular or substantially perpendicular to the direction in which the tensile stress is applied. This is because when the ends of the portions of the Ni plating layers that are in contact with the ceramic body expand along a surface of the ceramic body, the contact area between the ends of the Ni plating layers and the surface of the ceramic body increases, so that the above-described shearing stress increases. As a result, force that pushes the ceramic body upward is applied to the ceramic body through the ends of the Ni plating layers, and cracks are easily formed in the ceramic body.

Figure 3:
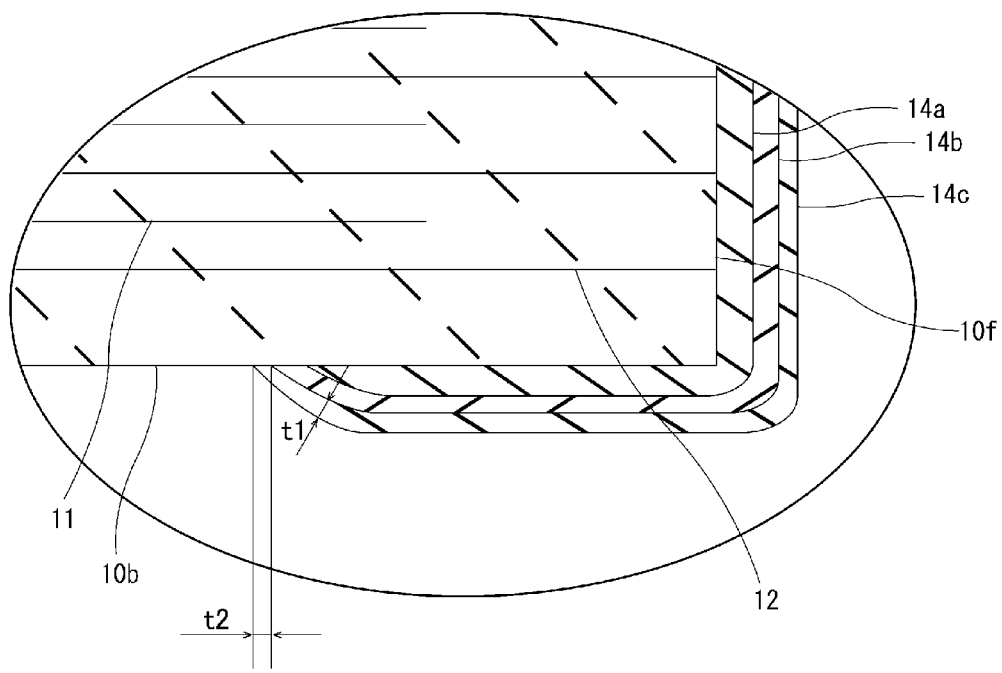
FIG. 3 is an enlarged view of a portion of FIG. 2.

Referring to FIG. 3, in the present preferred embodiment, t1 represents a thickness of the first Ni plating layer 13c or the second Ni plating layer 14c at a position separated, by about 20 μm, for example, along the plating layer, from a portion of the plating layer that is in contact with the principal surface 10a or 10b of the ceramic body 10. Also, t2 represents the distance by which a portion of the first Ni plating layer 13c or the second Ni plating layer 14c that is in contact with the second principal surface 10b extends in the length direction. In this case, t2/t1 is preferably less than about 1, for example. Therefore, concentration of the shearing stress at the first and second Ni plating layers 13c and 14c is significantly reduced or prevented. Accordingly, formation of cracks that extend from the portions of the first and second Ni plating layers 13c and 14c that are in contact with the ceramic body 10 is significantly reduced or prevented.

Preferably, t2/t1 preferably is greater than about 0.06, for example. In this case, not only are the formation and propagation of cracks significantly reduced or prevented, but the occurrence of solder leaching at the edges of the portions of the first and second Ni plating layers disposed on the second principal surface 10b is significantly reduced or prevented.

The manufacturing method of the ceramic electronic component 1 is not particularly limited. The ceramic electronic component 1 can be manufactured by, for example, the following method.

First, the ceramic body 10 including the first and second inner electrodes 11 and 12 is prepared. More specifically, ceramic green sheets are manufactured by spreading ceramic paste containing ceramic powder in a sheet shape by, for example, screen printing and drying the ceramic paste.

Next, conductive paste for forming the inner electrodes is applied to some of the ceramic green sheets in a certain pattern by, for example, screen printing. Thus, ceramic green sheets on which an inner-electrode-forming conductive pattern is formed and ceramic green sheets on which the inner-electrode-forming conductive pattern is not formed are prepared. A known binder or solvent may be contained in the ceramic paste or the conductive paste for forming the inner electrodes.

Next, a mother multilayer body is formed by stacking a certain number of ceramic green sheets on which the inner-electrode-forming conductive pattern is not formed, ceramic green sheets on which the inner-electrode-forming conductive pattern is formed and which are arranged sequentially, and a certain number of ceramic green sheets on which the inner-electrode-forming conductive pattern is not formed, in that order. The mother multilayer body may be pressed in the stacking direction by, for example, isostatic pressing as necessary.

A plurality of raw ceramic bodies are formed by cutting the mother multilayer body into a predetermined shape and size. The edges and corners of the raw ceramic bodies may be rounded by subjecting the raw ceramic bodies to barrel grinding or the like.

Then, the raw ceramic bodies are baked. Thus, the ceramic body 10 is completed. The baking temperature of the raw ceramic bodies may be set in accordance with the ceramic and the conductive material that are used. For example, the baking temperature of the raw ceramic bodies may be set to about 900° C. to about 1300° C.

Next, the first and second baked electrode layers 13a and 14a are formed by applying conductive paste to both end surfaces of the baked ceramic body 10 and burning the conductive paste. Preferably, the burning temperature is, for example, about 700° C. to about 1000° C. The first and second baked electrode layers 13a and 14a may instead be baked together with the raw ceramic bodies.

Next, conductive resin paste containing a conductive material and a resin is applied so as to cover the first and second baked electrode layers 13a and 14a, and are subjected to heat treatment at a temperature of about 150° C. to about 300° C. so that the resin is thermally cured. Thus, the first resin-containing electrode layer 13b is formed on the first baked electrode layer 13a, and the second resin-containing electrode layer 14b is formed on the second baked electrode layer 14a. The heat treatment may either be performed in an air atmosphere or a nitrogen atmosphere. In the case where the resin electrodes are formed by using Cu powder, the oxygen concentration in the heat treatment is preferably set to about 1000 ppm or less to prevent oxidation of the metal component.

Next, the first Ni plating layer 13c is formed so as to cover the first resin-containing electrode layer 13b, and the second Ni plating layer 14c is formed so as to cover the second resin-containing electrode layer 14b.

More specifically, as described below, the first and second Ni plating layers 13c and 14c may be formed by, for example, electroplating. In the electroplating process, a Ni plating bath having a pH of about 4.4 or more, for example, is preferably used. When a Ni plating bath having a pH of about 4.4 or more is used, a buffering function of a buffering agent, such as boric acid, contained in the Ni plating bath is reduced and t2/t1 is easily controlled to less than about 1. The value of t2/t1 is easily controlled to less than about 1 not only by using a Ni plating bath having a pH of about 4.4 but also by adjusting the electrifying conditions.

Lastly, Sn plating layers are formed so as to cover the first and second Ni plating layers 13c and 14c as necessary.

The ceramic electronic component 1 is completed by the above-described processes.

Other preferred embodiments of the present invention will now be described. In the following description, components having the same or substantially the same functions as those of the components of the first preferred embodiment are denoted by the same reference numerals and descriptions thereof are thus omitted.

Second Preferred Embodiment

Figure 4:
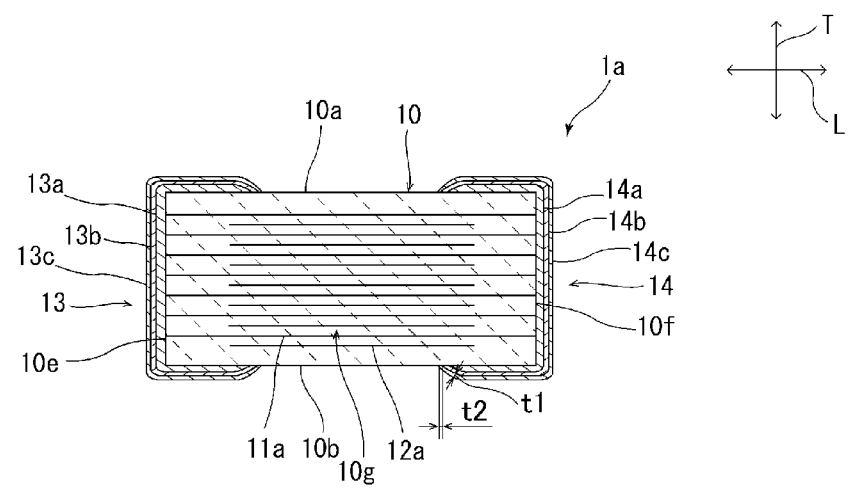
FIG. 4 is a schematic sectional view of a ceramic electronic component according to a second preferred embodiment of the present invention.

FIG. 4 is a schematic sectional view of a ceramic electronic component 1a according to a second preferred embodiment of the present invention.

The structure of the ceramic electronic component 1a illustrated in FIG. 4 differs from the structure of the ceramic electronic component 1 illustrated in FIG. 2 in that first inner electrodes 11a extend to first and second end surfaces 10e and 10f, and in that second inner electrodes 12a extend to first and second side surfaces 10c and 10d. Although not illustrated in FIG. 4, outer electrodes that are electrically connected to the second inner electrodes 12a are provided on the first and second side surfaces 10c and 10d. These outer electrodes and the first and second outer electrodes 13 and 14 define and serve as signal terminal electrodes and ground terminal electrodes, respectively, or ground terminal electrodes and signal terminal electrodes, respectively.

Also in the ceramic electronic component 1a according to the present preferred embodiment, t2/t1 described above is preferably less than about 1, for example. Accordingly, concentration of bending stress and shearing stress at the first and second Ni plating layers 13c and 14c is significantly reduced or prevented. As a result, formation of cracks that extend from the portions of the first and second Ni plating layers 13c and 14c that are in contact with the ceramic body 10 is significantly reduced or prevented.

The present invention will now be described in more detail by way of examples. However, the present invention is not limited to the following examples in any way, and modifications can be made as appropriate within the scope of the present invention.

Examples 1 to 7

As examples of the ceramic electronic component 1 according to the above-described preferred embodiments, ceramic capacitors similar to the ceramic electronic component 1 according to the above-described preferred embodiments, in which Sn plating layers having a thickness of about 3 μm (target value), for example, were formed on the Ni plating layers, were manufactured by using the manufacturing method according to the above-described preferred embodiments. Ten ceramic capacitors were manufactured for each example under the conditions given below. As shown in Table 1 given below, seven types of t2/t1 were set (Preferred Embodiments 1 to 7). The ceramic capacitors were subjected to a bending-and-holding test, and then occurrences of cracks and solder leaching were observed.

Size of Ceramic Capacitors: 3.2 mm (L)×2.5 mm (W)×2.5 mm (T) (design values)
Ceramic: $BaTiO_3$
Capacity: 10 μF
Rated Voltage: 50 V
Baking Temperature: 1200° C. (kept for 2 hours)
Material of Baked Electrode Layers: Cu
Conductive Material Contained in Resin-Containing Electrode Layers: Ag
Resin Contained in Resin-Containing Electrode Layers: Epoxy Resin
Heat-Curing Temperature: 200° C. to 250° C.
Target Thickness of Resin-Containing Electrode Layers: 60 μm to 120 μm (Target Value in Central Regions of End Surfaces)

The samples were mounted on land boards according to the standards of Japan Electronics and Information Technology Industries Association (JEITA) by reflow soldering using lead free (LF) solder, and the wiring boards were bent by a predetermined bending amount (e.g., about 5 mm) for approximately 5 seconds. Then, the samples were removed from the boards, and a side surface of each sample was ground to a central position of the sample in the width direction (e.g., about ½W). Then, occurrence of cracks on the ground surface of each sample was observed.

On the ground surface, the thickness of the second Ni plating layer 14c in the direction of the normal to the second Ni plating layer 14c was measured by using an optical microscope at two positions that were separated, by about 20 μm along the second Ni plating layer 14c, from the portions of the second Ni plating layer 14c that were in contact with the principal surfaces 10a and 10b of the ceramic body 10. Then, the average of the thicknesses was determined. Then, the average of the measurement results of the ten samples was determined as t1 in Table 1 given below.

On the ground surface, the distance by which the portion of the second Ni plating layer 14c that was in contact with the second principal surface 10b extends in the length direction L was measured by using an optical microscope. Then, the average of the measurement results of the ten samples was determined as t2 in Table 1 given below.

A solder immersion test was performed. In this test, the samples were immersed for ten seconds in a solder bath filled with lead free solder that was heated to about 300° C. Then, the samples were sufficiently cooled in a room, and a side surface of each sample was ground in the width direction. The ground surface was observed at a magnification of 50× by using a metal microscope. When an obvious color change into black caused by spreading of the resin contained in the second resin-containing electrode layer 14b into the solder was observed, it was determined that solder leaching had occurred.

The composition of the Ni plating bath was nickel sulfate 300 g/L, nickel chloride 45 g/L, and boric acid 40 mg/L. The bath temperature was set to about 55° C. In Table 1, pH was adjusted for each sample. More specifically, an appropriate amount of sulfuric acid was added to reduce pH, and an appropriate amount of nickel hydroxide was added to increase pH. The electrifying conditions are shown in Table 1.

A rotating barrel having a capacity of about 320 ml, a diameter of about 67 mm, and a width of about 110 mm was used as a plating device. Steel balls having a diameter of about 3.5 mm and a volume of about 60 ml were used as media. Nylon coated iron balls having a diameter of about 8.0 mm were used as mixing balls. The amount of chip charge was set to about 150 (3.3 ml), and the barrel rotating speed was set to about 30 rpm.

Comparative Examples 1 and 2

As comparative examples of the ceramic electronic component 1 according to the above-described preferred embodiments, ceramic capacitors similar to the ceramic electronic component 1 according to the above-described preferred embodiments, in which Sn plating layers having a thickness of about 3 μm (target value) were formed on the Ni plating layers, were manufactured by using the manufacturing method according to the above-described preferred embodiments. Ten ceramic capacitors were manufactured for each comparative example under the same conditions as the conditions for manufacturing the ceramic capacitors of the above-described examples. As shown in Table 1 given below, two types of t2/t1 were set (Comparative Examples 1 and 2). The ceramic capacitors were subjected to a bending-and-holding test, and then occurrences of cracks and solder leaching were observed.

The results of Examples 1 to 7 and Comparative Examples 1 and 2 are shown in Table 1.

TABLE 1

|  | t1 (μm) | t2 (μm) | t2/t1 | Ni Plating pH | Ni Plating Current Value (A) | Ni Plating Time (min) | No. of Cracks/ No. of Samples | No. of Occurrences of Solder Leaching |
|---|---|---|---|---|---|---|---|---|
| Example 1 | 10.0 | 2.3 | 0.23 | 5.2 | 8 | 80 | 0/10 | 0/10 |
| Example 2 | 11.4 | 4.1 | 0.36 | 5 | 8 | 80 | 0/10 | 0/10 |
| Example 3 | 10.2 | 5.8 | 0.59 | 4.8 | 8 | 80 | 0/10 | 0/10 |
| Example 4 | 9.6 | 7 | 0.73 | 4.6 | 8 | 80 | 0/10 | 0/10 |
| Example 5 | 10.2 | 9 | 0.88 | 4.4 | 8 | 80 | 0/10 | 0/10 |

TABLE 1-continued

| | t1 (μm) | t2 (μm) | t2/t1 | Ni Plating pH | Ni Plating Current Value (A) | Ni Plating Time (min) | No. of Cracks/ No. of Samples | No. of Occurrences of Solder Leaching |
|---|---|---|---|---|---|---|---|---|
| Example 6 | 6.2 | 0.2 | 0.03 | 5.4 | 4 | 160 | 0/10 | 8/10 |
| Example 7 | 8.4 | 0.5 | 0.06 | 5.2 | 4 | 160 | 0/10 | 1/10 |
| Comparative Example 1 | 12.0 | 12 | 1.00 | 4.2 | 8 | 80 | 1/10 | 0/10 |
| Comparative Example 2 | 12.0 | 14.1 | 1.18 | 4 | 8 | 80 | 4/10 | 0/10 |

As is clear from the above-described results, when t2/t1 is less than about 1, concentration of shearing stress at the Ni plating layers is significantly reduced or prevented. As a result, formation of cracks that extend from the portions of the Ni plating layers that are in contact with the ceramic body is significantly reduced or prevented.

In addition, it was confirmed that, when t2/t1 is greater than about 0.06, not only is the formation of cracks significantly reduced or prevented, but the occurrence of solder leaching at the edges of the portions of the Ni plating layers on the second principal surface is significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic electronic component comprising:
   a ceramic body including first and second principal surfaces that extend in a length direction and a width direction, first and second side surfaces that extend in the length direction and a thickness direction, and first and second end surfaces that extend in the width direction and the thickness direction; and
   an outer electrode arranged so as to extend from the first end surface of the ceramic body to the second principal surface of the ceramic body; wherein
   the outer electrode includes:
      a resin-containing electrode layer provided on the ceramic body and containing a conductive material and a resin; and
      a plating layer provided on the resin-containing electrode layer, the plating layer including a Ni plating layer; wherein
   when a thickness of the Ni plating layer is t1 and a distance by which a portion of the Ni plating layer that is in contact with the second principal surface extends in the length direction is t2, t2/t1 is less than about 1.

2. The ceramic electronic component according to claim 1, wherein t2/t1 is greater than about 0.06.

3. The ceramic electronic component according to claim 1, wherein the outer electrode further includes a baked electrode layer disposed between the ceramic body and the resin-containing electrode layer.

4. The ceramic electronic component according to claim 1, wherein the ceramic electronic component is one of a ceramic capacitor, a piezoelectric component, a thermistor, and an inductor.

5. The ceramic electronic component according to claim 1, wherein the ceramic body includes at least one of a dielectric ceramic, a piezoelectric ceramic, a semiconductor ceramic, and a magnetic ceramic.

6. The ceramic electronic component according to claim 1, wherein the ceramic body includes at least one of a Mn compound, a Mg compound, a Si compound, a Fe compound, a Cr compound, a Co compound, a Ni compound, and a rare-earth compound.

7. The ceramic electronic component according to claim 1, wherein the outer electrode extends to extends from the first end surface to the first principal surface.

8. The ceramic electronic component according to claim 1, wherein the outer electrode extends to extends from the first end surface to the first and second side surfaces.

9. The ceramic electronic component according to claim 1, wherein the conductive material is one of Ag and Cu.

10. The ceramic electronic component according to claim 1, wherein the conductive material includes a mixture of spherical and flat particles.

11. The ceramic electronic component according to claim 1, wherein the resin includes at least one of an epoxy resin, a phenolic resin, a urethane resin, a silicone resin, and a polyimide resin.

12. The ceramic electronic component according to claim 1, wherein the ceramic body includes first internal electrodes that extend to the first end surface and second internal electrodes that extend to the second end surface.

13. The ceramic electronic component according to claim 1, wherein the ceramic body includes first and second internal electrodes that extend to the first and second side surfaces.

14. A method for manufacturing the ceramic electronic component according to claim 1, the method comprising:
   forming the Ni plating layer by using a Ni plating bath having a pH of about 4.4 or more.

15. The method according to claim 14, wherein t2/t1 is greater than about 0.06.

16. The method according to claim 14, wherein the outer electrode further includes a baked electrode layer disposed between the ceramic body and the resin-containing electrode layer.

17. The method according to claim 16, wherein the baked electrode layer is baked at a temperature of about 700° C. to about 1000° C.

18. The method according to claim 14, wherein the ceramic body is baked at a temperature of about 900° C. to about 1300° C.

19. The method according to claim 14, wherein the resin-containing electrode layer includes a conductive resin paste that is subjected to a heat treatment at a temperature of about 150° C. to about 300° C.

20. The method according to claim 14, wherein an Sn plating layer is formed on the Ni plating layer.

* * * * *